United States Patent
Yoshioka et al.

(10) Patent No.: US 10,355,704 B2
(45) Date of Patent: Jul. 16, 2019

(54) AMPLIFIER CIRCUITRY, AD CONVERTER, AND WIRELESS COMMUNICATION DEVICE

(71) Applicant: KABUSHIKI KAISHA TOSHIBA, Minato-ku (JP)

(72) Inventors: Kentaro Yoshioka, Kawasaki (JP); Tetsuro Itakura, Nerima (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/919,912

(22) Filed: Mar. 13, 2018

(65) Prior Publication Data
US 2019/0089365 A1  Mar. 21, 2019

(30) Foreign Application Priority Data
Sep. 19, 2017  (JP) .................. 2017-179494

(51) Int. Cl.
| | | |
|---|---|---|
| H03F 3/00 | (2006.01) | |
| H03M 1/00 | (2006.01) | |
| H03F 3/45 | (2006.01) | |
| H03F 3/21 | (2006.01) | |
| H03F 3/19 | (2006.01) | |

(Continued)

(52) U.S. Cl.
CPC .......... *H03M 1/002* (2013.01); *H03F 1/0205* (2013.01); *H03F 3/19* (2013.01); *H03F 3/21* (2013.01); *H03F 3/45179* (2013.01); *H04W 52/0209* (2013.01); *H03F 2200/375* (2013.01); *H03F 2200/451* (2013.01); *H03F 2203/45022* (2013.01); *H03F 2203/45026* (2013.01)

(58) Field of Classification Search
CPC ..... H03M 1/002; H03M 1/124; H03F 1/0205; H03F 3/19; H03F 3/45179; H03F 3/45; H03F 3/21; H03F 2203/45022; H03F 2200/451; H03F 2200/375; H03F 2203/45026; H04W 52/0209
See application file for complete search history.

(56) References Cited

U.S. PATENT DOCUMENTS 6,433,712 B1 * 8/2002 Ohnhaeuser ........ H03M 1/1019
341/118
9,577,659 B2  2/2017 Yoshioka et al.
(Continued)

FOREIGN PATENT DOCUMENTS

JP  2016-225840  12/2016

OTHER PUBLICATIONS

Kentaro Yoshioka, et al. "A 0.7V 12b 160MS/s 12.8fJ/conv-step Pipelined-SAR ADC in 28nm CMOS with Digital Amplifier Technique", IEEE ISSCC, 2017, 3 pages.

*Primary Examiner* — Syed Haider
(74) *Attorney, Agent, or Firm* — Oblon, McClelland, Maier & Neustadt, L.L.P.

(57) ABSTRACT

Amplifier circuitry has sampling circuitry which samples an input voltage, a quantizer which quantizes an output voltage of the sampling circuitry and outputs an output code, a differential amplifier which amplifies a differential voltage between the output voltage of the sampling circuitry and a reference voltage and performs offset adjustment according to the output code of the quantizer, and a first capacitor which is connected between an output node of the differential amplifier and an output node of the sampling circuitry.

19 Claims, 14 Drawing Sheets

(51) Int. Cl.
*H04W 52/02* (2009.01)
*H03F 1/02* (2006.01)

(56) References Cited

U.S. PATENT DOCUMENTS

| | | | |
|---|---|---|---|
| 2003/0128145 A1* | 7/2003 | Naka | H03M 1/002 |
| | | | 341/155 |
| 2005/0206543 A1* | 9/2005 | Draxelmayr | H03M 3/372 |
| | | | 341/143 |
| 2016/0006452 A1* | 1/2016 | Saito | H03M 3/418 |
| | | | 348/302 |
| 2016/0043733 A1* | 2/2016 | Nezuka | H03M 3/464 |
| | | | 341/143 |
| 2016/0248380 A1* | 8/2016 | Lee | H03F 1/0205 |
| 2016/0352349 A1 | 12/2016 | Yoshioka et al. | |

\* cited by examiner

AMPLIFIER CIRCUITRY, AD CONVERTER, AND WIRELESS COMMUNICATION DEVICE

CROSS REFERENCE TO RELATED APPLICATIONS

This application is based upon and claims the benefit of priority from the prior Japanese Patent Application No. 2017-179494, filed on Sep. 19, 2017, the entire contents of which are incorporated herein by reference.

FIELD

Embodiments of the present disclosure relate to an amplifier circuitry, an AD converter, and a wireless communication device.

BACKGROUND

An amplifier circuitry that performs control for approximating an input voltage of a negative feedback amplifier to zero, increases gain, and improve amplification accuracy has been suggested.

However, in this type of amplifier circuitry, a DA converter is connected to an output node of the negative feedback amplifier. Because the DA converter generally has a large area, a circuitry area of the amplifier circuitry also increases and power consumption also increases accordingly.

DETAILED DESCRIPTION

Figure 1:
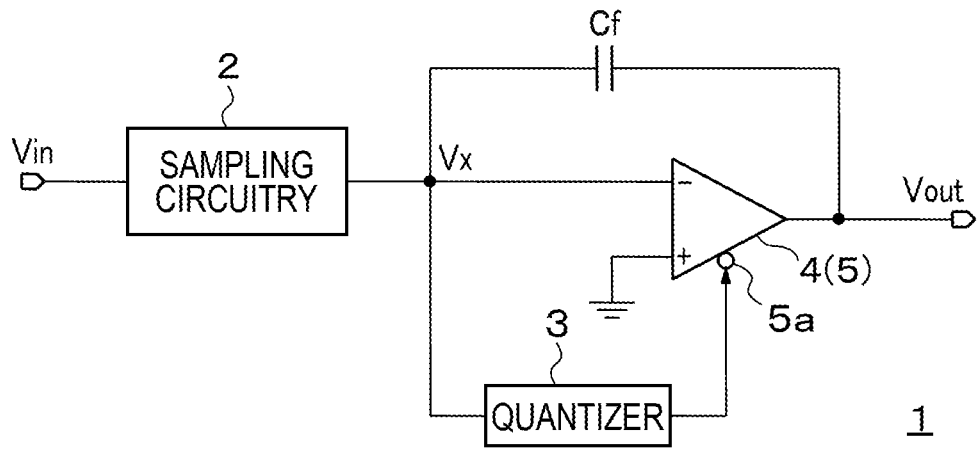
FIG. 1 is a block diagram showing a schematic configuration of an amplifier circuitry according to a first embodiment.

According to one embodiment, amplifier circuitry has sampling circuitry which samples an input voltage, a quantizer which quantizes an output voltage of the sampling circuitry and outputs an output code, a differential amplifier which amplifies a differential voltage between the output voltage of the sampling circuitry and a reference voltage and performs offset adjustment according to the output code of the quantizer, and a first capacitor which is connected between an output node of the differential amplifier and an output node of the sampling circuitry.

Hereinafter, embodiments will be described with reference to the drawings. In the present specification and the accompanying drawings, some components are omitted, changed, or simplified for ease understanding and illustration. However, this embodiment should be interpreted to include technical contents to the extent that the same functions can be expected. In addition, in the drawings attached to the present specification, for convenience of illustration and ease of understanding, scales and aspect ratios are appropriately changed and exaggerated from the actual objects.

(First Embodiment)

FIG. 1 is a block diagram showing a schematic configuration of an amplifier circuitry 1 according to a first embodiment. The amplifier circuitry 1 of FIG. 1 is a circuitry that amplifies an input voltage Vin and outputs the input voltage. The amplifier circuitry 1 of FIG. 1 includes a sampling circuitry 2, a quantizer 3, a differential amplifier 4, and a feedback capacitor (first capacitor) Cf.

Figure 2:
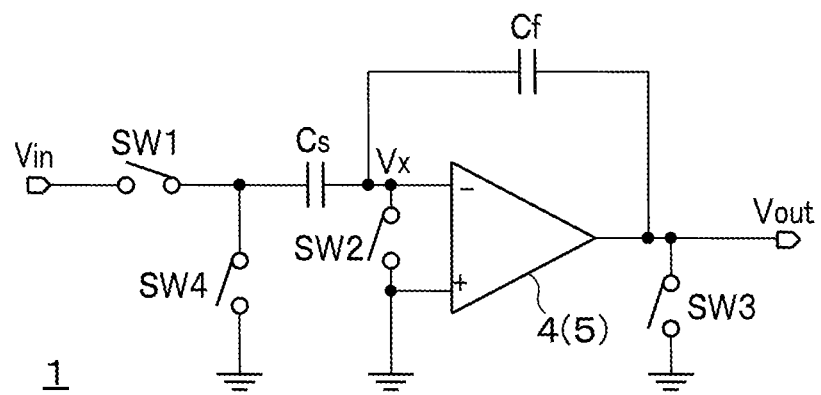
FIG. 2 is a circuitry diagram showing an example of an internal configuration of a sampling circuitry.

The sampling circuitry 2 samples the input voltage Vin. FIG. 2 is a circuitry diagram showing an example of an internal configuration of the sampling circuitry 2. The sampling circuitry 2 of FIG. 2 has a sampling capacitor (second capacitor) Cs and a plurality of switches SW1 to SW4. The sampling capacitor Cs accumulates charges according to the input voltage Vin. The plurality of switches SW1 to SW4 control charging and discharging of the sampling capacitor Cs. When the switches SW1 to SW3 are turned on, charges according to the input voltage Vin are charged in the sampling capacitor Cs. At this time, an output voltage Vout of the amplifier circuitry 1 is set to zero. When the switches SW1 to SW3 are turned off and the switch SW4 is turned on, a part of the charges of the sampling capacitor Cs is discharged and transferred to the feedback capacitor Cf.

The differential amplifier 4 amplifies a differential voltage between a voltage of an inverting input terminal and a reference voltage (for example, a ground voltage) and performs offset adjustment according to an output code of the quantizer 3. FIG. 1 shows an example of the case in which an operational amplifier 5 is used as the differential amplifier 4. Hereinafter, the example of the case in which the operational amplifier 5 is used as the differential amplifier 4 is described. However, it is not essential to use the operational amplifier 5.

In addition, although the reference voltage is the ground voltage in FIG. 1, the reference voltage may be set to a fixed voltage level other than the ground voltage.

One end of the sampling capacitor Cs and one end of the feedback capacitor Cf are connected to an inverting input terminal of the operational amplifier 5. Hereinafter, a voltage of the inverting input terminal of the operational amplifier 5 is referred to as an inverting input terminal voltage Vx. An output terminal of the operational amplifier 5 outputs an output voltage Vout obtained by amplifying the input voltage Vin. The feedback capacitor Cf is connected between the output terminal and the inverting input terminal of the operational amplifier 5. A non-inverting input terminal of the operational amplifier 5 is set to the reference voltage (for example, the ground voltage). As such, an output node of the sampling circuitry 2, the inverting input terminal of the operational amplifier 5, an input node of the quantizer 3, and one end of the feedback capacitor Cf are commonly connected and a voltage of a common connection node is the inverting input terminal voltage Vx.

The operational amplifier 5 has an offset control terminal 5a. The output code of the quantizer 3 is input to the offset control terminal 5a. The operational amplifier 5 performs offset adjustment on the basis of the output code of the quantizer 3 input to the offset control terminal 5a and outputs an output voltage after the offset adjustment.

The quantizer 3 quantizes the output voltage Vx of the sampling circuitry 2, that is, the inverting input terminal voltage Vx of the operational amplifier 5, and outputs an output code. The output code output from the quantizer 3 is input to the offset control terminal 5a of the operational amplifier 5 as described above. The output code of the quantizer 3 is a digital signal including a plurality of bits. Therefore, an output of the offset control terminal 5a of the operational amplifier 5 to which the output code of the quantizer 3 is input also includes a plurality of bits.

In the amplifier circuitry 1 of FIG. 1, an amplification error generated by an offset of the operational amplifier 5 appears at the inverting input terminal voltage Vx. When the operational amplifier 5 has an infinite amplification gain, an amplification factor of the amplifier circuitry 1 becomes an amplification factor (=Cs/Cf) determined by a capacity ratio between the sampling capacitor Cs and the feedback capacitor Cf. An amplifier that can determine the amplification factor by the capacity ratio between the sampling capacitor Cs and the feedback capacitor Cf is originally desirable. In a highly accurate AD converter, a highly accurate amplifier is indispensable.

However, in actuality, because the amplification gain of the operational amplifier 5 has a finite value, an actual amplification factor does not become Cs/Cf and an amplification error occurs. The amplification error appears when the inverting input terminal voltage Vx has a non-zero value. In other words, if the inverting input terminal voltage Vx becomes zero, the amplification error can be minimized. Therefore, in this embodiment, the operational amplifier 5 is configured to have an offset variable function and the inverting input terminal voltage Vx is converged to zero by the offset adjustment. If the inverting input terminal voltage Vx becomes zero, the operational amplifier 5 can perform ideal, strictly, highly accurate amplification.

In the amplifier circuitry 1 according to this embodiment, the amplification error generated by the amplification of the operational amplifier 5 is detected by the quantizer 3. More specifically, the quantizer 3 detects the amplification error by quantizing the inverting input terminal voltage Vx. If the inverting input terminal voltage Vx is zero, the amplification of the operational amplifier 5 is ideal and there is no need to vary the offset. On the other hand, if the inverting input terminal voltage Vx is not zero, the operational amplifier 5 includes the amplification error and an output code according to the amplification error is output from the quantizer 3. By controlling the offset of the operational amplifier 5 on the basis of the output code, the inverting input terminal voltage Vx of the operational amplifier 5 is converged to zero.

Figure 3:
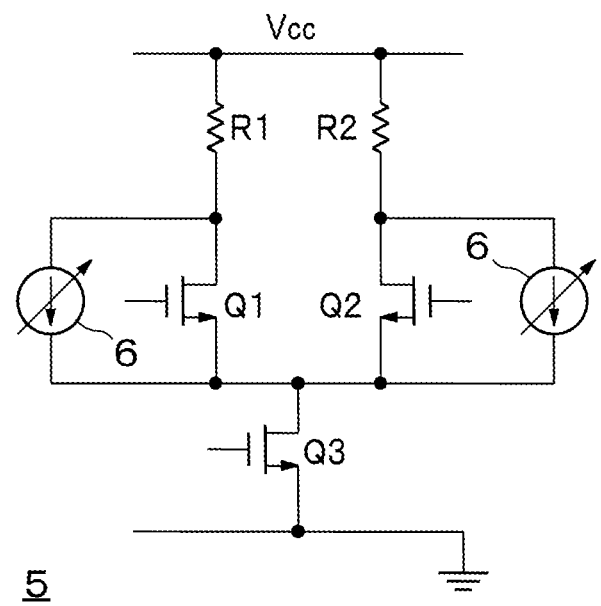
FIG. 3 is a circuitry diagram showing an example of an internal configuration of an operational amplifier.

FIG. 3 is a circuitry diagram showing an example of an internal configuration of the operational amplifier 5. The operational amplifier 5 of FIG. 3 includes a pair of transistors Q1 and Q2, a transistor Q3 connected between sources of the transistors Q1 and Q2 and a ground node, resistors R1 and R2 connected between drains of the transistors Q1 and Q2 and a power supply voltage node Vcc, and offset current sources 6 connected in parallel between the drains and the sources of the transistors Q1 and Q2. The output terminal of the operational amplifier 5 is connected to a connection node between the resistor R1 and the drain of the transistor Q1 or a connection node between the resistor R2 and the drain of the transistor Q2.

The offset current source 6 functions as an offset control circuitry that controls an amplification factor of a differential voltage between the inverting input terminal voltage Vx and the non-inverting input terminal voltage of the operational amplifier 5, according to the output code of the quantizer 3 input to the offset control terminal 5a. More specifically, the offset current source 6 supplies a current according to the output code of the quantizer 3 input to the offset control terminal 5a. If the current flowing through the offset current source 6 changes, the current flowing through the resistors R1 and R2 also changes and an output voltage of the operational amplifier 5 changes. As a result, an offset adjusted output voltage is generated.

Figure 4:
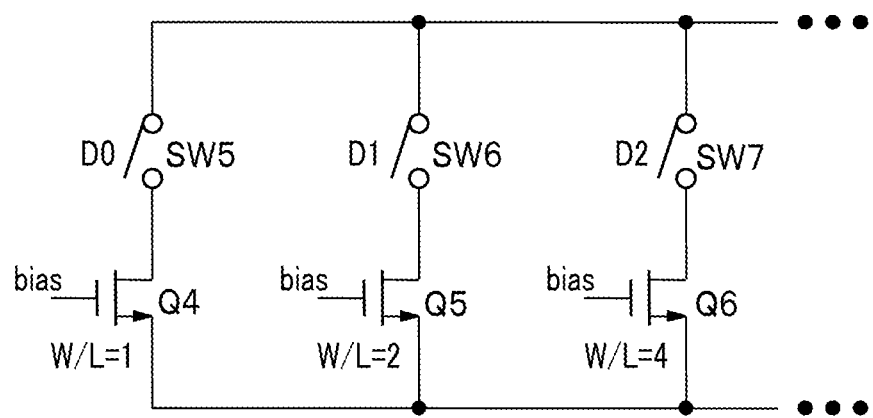
FIG. 4 is a circuitry diagram showing an example of an internal configuration of an offset current source.

FIG. 4 is a circuitry diagram showing an example of an internal configuration of the offset current source 6. The offset current source 6 of FIG. 4 has a plurality of transistors Q4 to Q6 and switches SW5 to SW7 connected to drains of the transistors Q4 to Q6. The offset current source 6 of FIG. 4 commonly connects one end of the switches SW5 to SW7 and commonly connects sources of the transistors Q4 to Q6, thereby configuring a parallel circuitry.

A ratio (=W/L) between a gate width W and a gate length L of each of the transistors Q4 to Q6 is different by a multiple of 2, for example. A common bias voltage is applied to a gate of each of the transistors Q4 to Q6. The switches SW5 to SW7 are turned on or off according to the output code of the quantizer 3 input to the offset control terminal 5a. Each of the switches SW5 to SW7 is associated with each bit of the output code of the quantizer 3. The switch connected to the transistor having larger W/L is associated with an upper bit of the output code of the quantizer 3 and the switch connected to the transistor having smaller W/L is associated with a lower bit. Therefore, if the upper bit of the output code of the quantizer 3 becomes 1, the offset current source 6 supplies a larger current.

As such, the offset current source 6 supplies a current according to the output code of the quantizer 3. If the current supplied by the offset current source 6 changes, the output voltage of the operational amplifier 5 changes. Therefore, the operational amplifier 5 of FIG. 3 changes the output voltage, according to the output code of the quantizer 3. That is, this means that the offset adjustment of the operational amplifier 5 is performed according to the output code of the quantizer 3.

Figure 5:
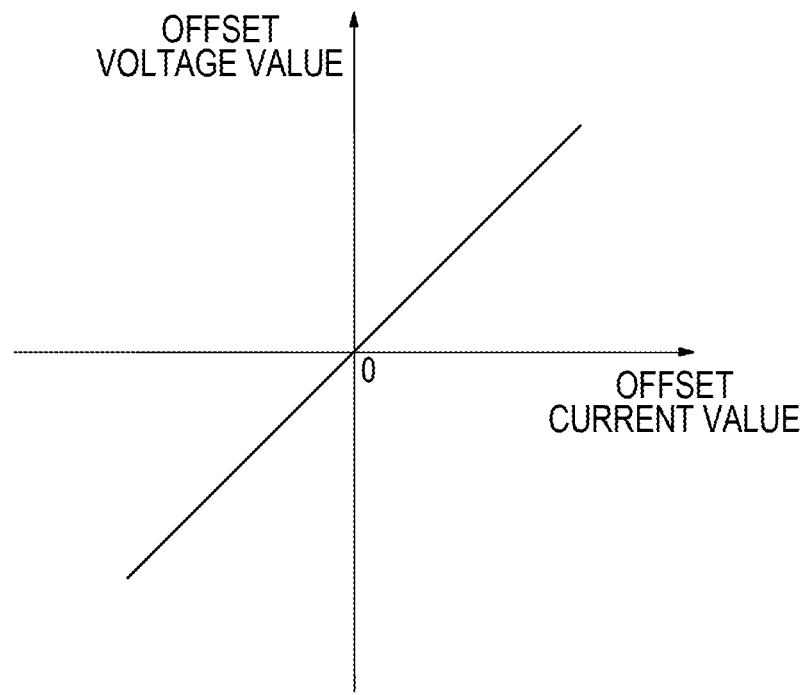
FIG. 5 is a graph showing a relation of an offset current flowing through the offset current source of FIG. 3 and an offset voltage of the operational amplifier of FIG. 3.

FIG. 5 is a graph showing a relation of an offset current flowing through the offset current source 6 of FIG. 3 and an offset voltage of the operational amplifier 5 of FIG. 3. As shown in the graph of FIG. 5, the offset current and the offset voltage are in a linear relation and the offset voltage changes linearly according to the offset current. As a result, the offset voltage can be changed linearly according to the output code of the quantizer 3.

Figure 6:
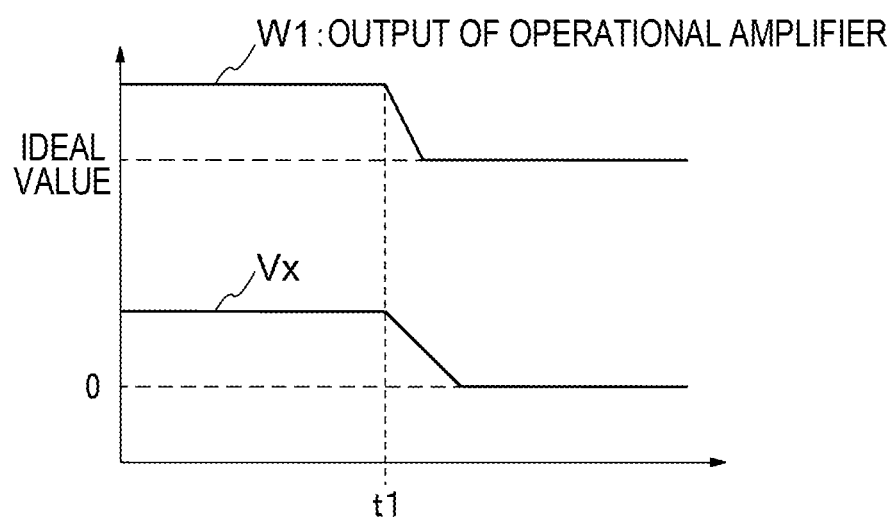
FIG. 6 is an operation waveform diagram of the amplifier circuitry according to the first embodiment.

FIG. 6 is an operation waveform diagram of the amplifier circuitry 1 according to this embodiment. A waveform W1 of FIG. 6 is an output voltage value of the operational amplifier 5. A voltage before time t1 becomes a voltage obtained by adding the offset voltage to an ideal output value. In addition, the inverting input terminal voltage Vx of the operational amplifier 5 initially becomes a voltage to which the offset voltage is added. Before time t1, processing for sampling the input voltage Vin by the sampling circuitry 2, processing for performing an amplification operation by the operational amplifier 5, and processing for quantizing the output voltage Vx of the sampling circuitry 2 by the quantizer 3 are executed sequentially and continuously. After time t1, feedback control is performed so that the non-inverting input terminal voltage becomes zero, on the basis of the output code of the quantizer 3. As a result, both the output voltage of the operational amplifier 5 and the non-inverting input terminal voltage decrease linearly. Eventually, the output voltage value of the operational amplifier 5 becomes an ideal value and the non-inverting input terminal voltage becomes zero.

Figure 7:
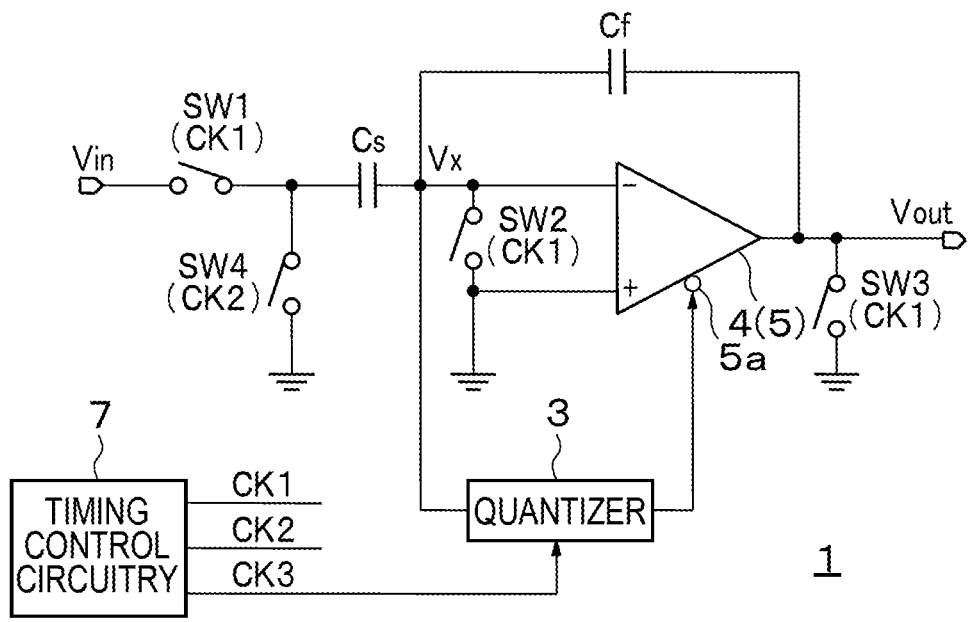
FIG. 7 is a block diagram of the case in which a timing control circuitry is added to the amplifier circuitry 1 of FIG. 1.

FIG. 7 is a block diagram of the case in which a timing control circuitry 7 is added to the amplifier circuitry 1 of FIG. 1. The timing control circuitry 7 of FIG. 7 executes control for sequentially repeating a first period in which charges according to the sampling voltage of the input voltage Vin are accumulated in the sampling capacitor Cs, a second period in which the differential voltage is amplified by the differential amplifier 4, and a third period in which the output voltage Vx of the sampling circuitry 2 is quantized by the quantizer 3. The timing control circuitry 7 of FIG. 7 generates the first to third clock signals CK1 to CK3 indicating switching of the first to third periods. The sampling circuitry 2, the operational amplifier 5, and the quantizer 3 sequentially repeat the operations of the first to third periods in synchronization with the first to third clock signals CK1 to CK3.

For example, the switches SW1 to SW3 in the sampling circuitry 2 are turned on when the first clock signal CK1 is high and are turned off when the first clock signal CK1 is low. In addition, the switch SW4 in the sampling circuitry 2 is turned on when the second clock signal CK2 is high and is turned off when the second clock signal CK2 is low. As a result, the sampling circuitry 2 samples the input voltage Vin in the first period, and the operational amplifier 5 amplifies the sampling voltage in the second period.

Figure 8:
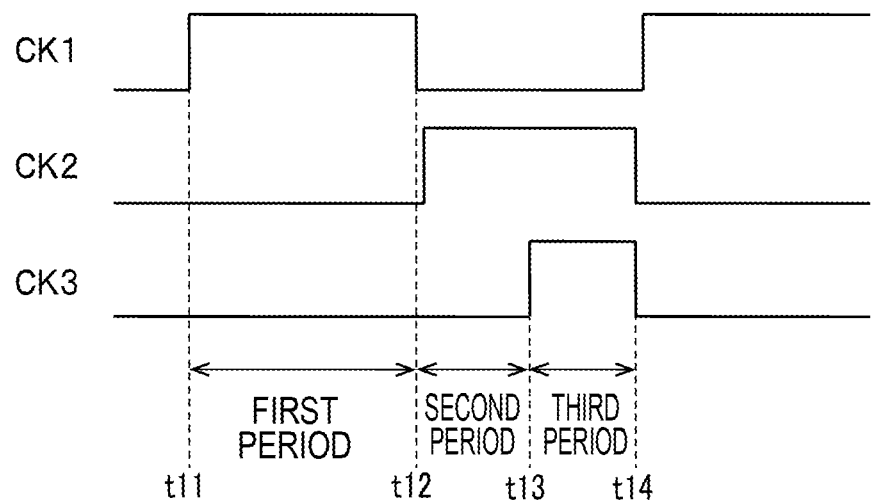
FIG. 8 is a timing waveform diagram of first to third clock signals CK1 to CK3.

FIG. 8 is a timing waveform diagram of the first to third clock signals CK1 to CK3. The timing control circuitry 7 sets both the second clock signal CK2 and the third clock signal CK3 to low in a period (from time t11 to time t12) in which the first clock signal CK1 is high. If the first clock signal CK1 changes from low to high (time t12), the timing control circuitry 7 sets the second clock signal CK2 to high. While the second clock signal CK2 is high, the timing control circuitry 7 delays the third clock signal CK3 and sets the third clock signal CK3 to high (time t13). Then, the timing control circuitry 7 sets the first clock signal CK1 to high in accordance with timing t14 at which both the second clock signal CK2 and the third clock signal CK3 are turned off.

In an example of FIG. 8, the sampling circuitry 2 samples the input voltage Vin in a period (from time t11 to time t12: first period) in which the first clock signal CK1 is high. The operational amplifier 5 amplifies the differential voltage between the non-inverting input terminal voltage and the ground voltage in a period (from time t12 to time t13: second period) in which the second clock signal CK2 is high and the third clock signal CK3 is low and the quantizer 3 quantizes the inverting input terminal voltage Vx of the operational amplifier 5 in a subsequent period (from time t13 to time t14: third period).

By repeating the above operations (from time t11 to time t14) in synchronization with the first to third clock signals CK1 to CK3 output from the timing control circuitry 7, the inverting input terminal voltage Vx of the operational amplifier 5 converges to zero.

Figure 9:
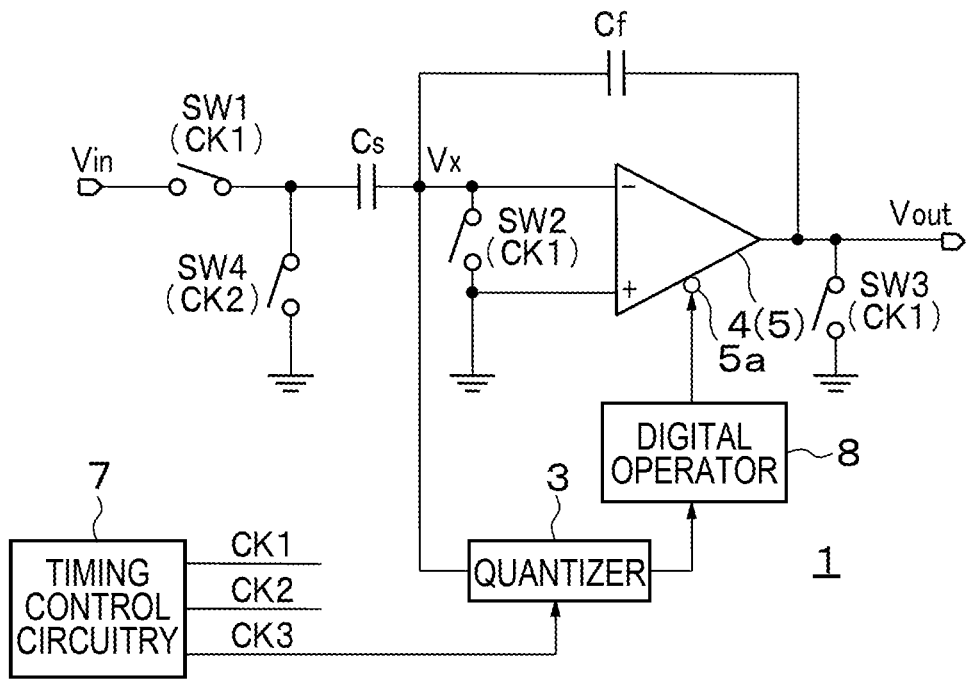
FIG. 9 is a diagram showing an amplifier circuitry in which a digital operator to output an adjustment output code obtained by multiplying an output code of a quantizer by a predetermined value is connected to a rear stage of the quantizer.

The output code of the quantizer 3 may vary due to manufacturing variations of the amplifier circuitry 1. Therefore, as shown in FIG. 9, a digital operator 8 to output an adjustment output code obtained by multiplying the output code of the quantizer 3 by a predetermined value may be connected to a rear stage of the quantizer 3 of the amplifier circuitry 1 of FIG. 7. In addition, the digital operator 8 may be connected to the rear stage of the quantizer 3 of the amplifier circuitry 1 of FIG. 7.

The digital operator 8 executes processing for multiplying the output code of the quantizer 3 by a predetermined value (hereinafter, referred to as −K). The predetermined value is a value that varies due to the manufacturing variations of the amplifier circuitry 1 of FIG. 1 or 7. Therefore, preferably, in a manufacturing step of the amplifier circuitry 1 of FIG. 1 or 7, the predetermined value is tuned to an optimal value for each amplifier circuitry 1 and the output code of the quantizer 3 is multiplied by the predetermined value by the digital operator 8. In the case in which the digital operator 8 is provided in the rear stage of the quantizer 3, the output code of the digital operator 8 is input to the offset control terminal 5a of the operational amplifier 5.

As such, the amplifier circuitry 1 according to the first embodiment is a negative feedback amplifier circuitry that feeds back the output voltage of the operational amplifier 5 to the inverting input terminal of the operational amplifier 5 via the feedback capacitor Cf, and adjusts the offset of the operational amplifier 5 according to the inverting input terminal voltage Vx so that the inverting input terminal voltage Vx of the operational amplifier 5 becomes zero. As a result, a DA converter becomes unnecessary as compared with the case in which offset adjustment is performed on the basis of a signal fed back after the output voltage of the operational amplifier 5 is DA-converted. Therefore, a circuitry area of the amplifier circuitry 1 can be reduced. In this embodiment, the negative feedback control is performed so that the inverting input terminal voltage Vx becomes zero. Therefore, a magnification error can be suppressed and amplification accuracy can be improved. In addition, in this embodiment, the amplification accuracy can be improved without depending on the performance of the differential amplifier 4 composed of the operational amplifier 5. Therefore, it is not necessary to use the differential amplifier 4 with high performance and high power consumption and the power consumption of the amplifier circuitry 1 can be reduced.

(Second Embodiment)

In a second embodiment, an output code of a quantizer 3 is converted into an analog voltage and is then input to a non-inverting input terminal of an operational amplifier 5.

Figure 10:
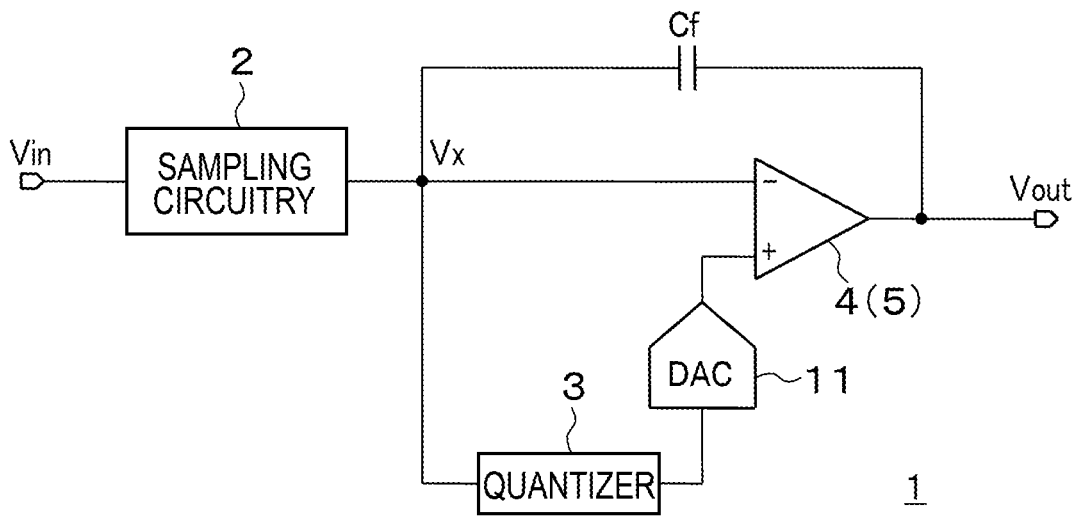
FIG. 10 is a block diagram showing a schematic configuration of an amplifier circuitry according to a second embodiment.

FIG. 10 is a block diagram showing a schematic configuration of an amplifier circuitry 1 according to the second embodiment. The amplifier circuitry 1 of FIG. 10 includes a DA converter (DAC: Digital Analog Converter) 11 in addition to a sampling circuitry 2, a quantizer 3, an operational amplifier 5, and a feedback capacitor Cf.

The DA converter 11 converts the output code of the quantizer 3 into an analog voltage. The analog voltage converted by the DA converter 11 is input to the non-inverting input terminal of the operational amplifier 5.

The operational amplifier 5 according to the first embodiment includes an offset control terminal 5a that receives the output code of the quantizer 3. However, the operational amplifier 5 of FIG. 10 does not include the offset control terminal 5a. The operational amplifier 5 of FIG. 10 amplifies a differential voltage between an inverting input terminal voltage Vx and the analog voltage according to the output code of the quantizer 3.

In the second embodiment, a non-inverting input terminal voltage of the operational amplifier 5 is adjusted according to the output code of the quantizer 3, so that offset adjustment of the operational amplifier 5 is performed. Before inputting the output code of the quantizer 3 to the DA converter 11, similar to FIG. 9, the output code of the quantizer 3 may be input to a digital operator 8, may be multiplied by a predetermined value, and may be input to the DA converter 11.

As such, in the second embodiment, the inverting input terminal voltage Vx of the operational amplifier 5 is set to the analog voltage according to the output code obtained by quantization by the quantizer 3 so that the inverting input terminal voltage Vx of the operational amplifier 5 becomes zero. According to this embodiment, the offset adjustment of the operational amplifier 5 is performed according to the inverting input terminal voltage Vx of the operational amplifier 5, so that the inverting input terminal voltage Vx can be converged to zero. As a result, similar to the first embodiment, a magnification error of the amplifier circuitry 1 can be suppressed and amplification accuracy can be improved. In addition, because it is not necessary to provide the offset control terminal 5a in the operational amplifier 5 according to the second embodiment, a configuration of the operational amplifier 5 can be simplified as compared with the first embodiment (Third Embodiment)

In a third embodiment, an offset addition circuitry is connected to an inverting input terminal of an operational amplifier 5.

Figure 11:
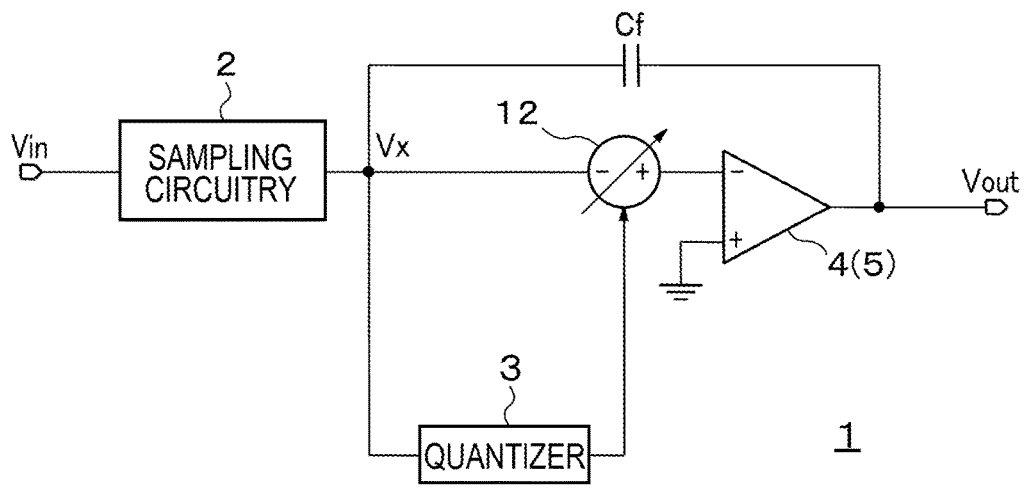
FIG. 11 is a block diagram showing a schematic configuration of an amplifier circuitry according to a third embodiment.

FIG. 11 is a block diagram showing a schematic configuration of an amplifier circuitry 1 according to the third embodiment. The amplifier circuitry 1 of FIG. 11 includes an offset addition circuitry 12 in addition to a sampling circuitry 2, a quantizer 3, an operational amplifier 5, and a feedback capacitor Cf. The offset addition circuitry 12 generates an offset addition voltage obtained by adding an analog voltage according to an output code of the quantizer 3 to an output voltage Vx of the sampling circuitry 2 and outputs the offset addition voltage. The offset addition voltage is input to the inverting input terminal of the operational amplifier 5.

Figure 12:
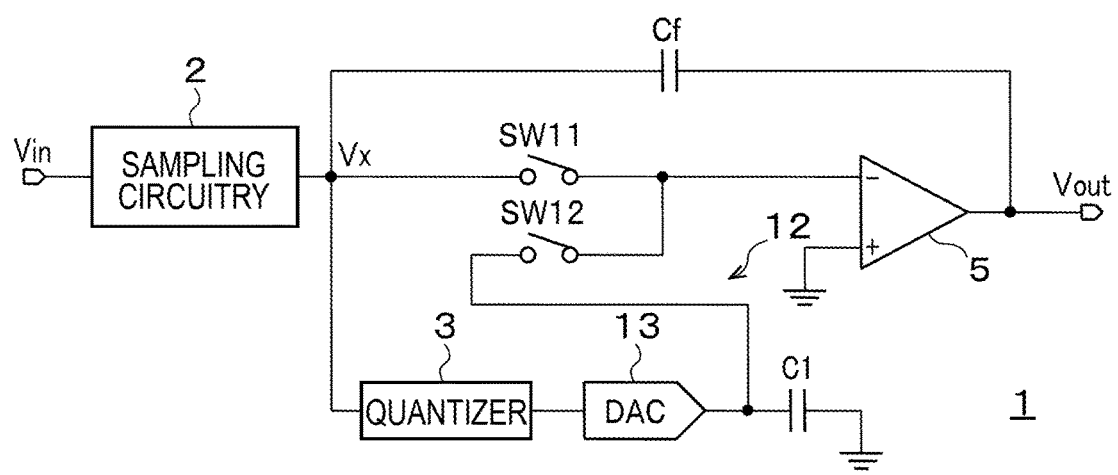
FIG. 12 is a block diagram showing an example of an internal configuration of an offset addition circuitry.

FIG. 12 is a block diagram showing an example of an internal configuration of the offset addition circuitry 12. The offset addition circuitry 12 has a DA converter (DAC) 13 that converts the output code of the quantizer 3 into an analog voltage, a capacitor C1 that accumulates charges according to the analog voltage, and reciprocal switches SW11 and SW12 that select one of an output voltage Vx of the sampling circuitry 2 and the analog voltage converted by the DA converter 13. In the reciprocal switches SW11 and SW12, when one switch SW11 is turned on, the other switch SW12 is turned off and when one switch SW11 is turned off, the other switch SW12 is turned on. As a result, it is possible to exclusively switch between inputting the output voltage Vx of the sampling circuitry 2 to the inverting input terminal of the operational amplifier 5 and inputting the analog voltage converted by the DA converter 13 to the inverting input terminal.

In a sampling period from time t11 to time t12 in FIG. 8 and an amplification period of the operational amplifier 5 from time t12 to time t13, one switch SW11 is turned on and the other switch SW12 is turned off and the output voltage Vx of the sampling circuitry 2 is input to the inverting input terminal of the operational amplifier 5. In a period from time t13 to time t14, one switch SW11 is turned off and the other switch SW12 is turned on and the analog voltage obtained by converting the output code of the quantizer 3 by the DA converter 13 is input to the inverting input terminal.

In the amplifier circuitry 1 of FIG. 12, before inputting the output code of the quantizer 3 to the DA converter 13, similar to FIG. 9, the output code of the quantizer 3 may be input to the digital operator 8, may be multiplied by a predetermined value, and may be input to the DA converter 13.

As such, in the amplifier circuitry 1 according to the third embodiment, because the offset addition circuitry 12 is connected to the inverting input terminal of the operational amplifier 5, an offset addition voltage according to the output code of the quantizer 3 can be input to the inverting input terminal. Therefore, it is possible to perform offset adjustment at the inverting input terminal side of the operational amplifier 5 so that the inverting input terminal voltage Vx of the operational amplifier 5 becomes zero. Even in the operational amplifier 5 according to the third embodiment, because an offset control terminal 5a is unnecessary, a configuration of the operational amplifier 5 can be simplified as compared with the first embodiment.

(Fourth Embodiment)

In a fourth embodiment, an operational amplifier 5 having an offset adjustment function is used.

Figure 13:
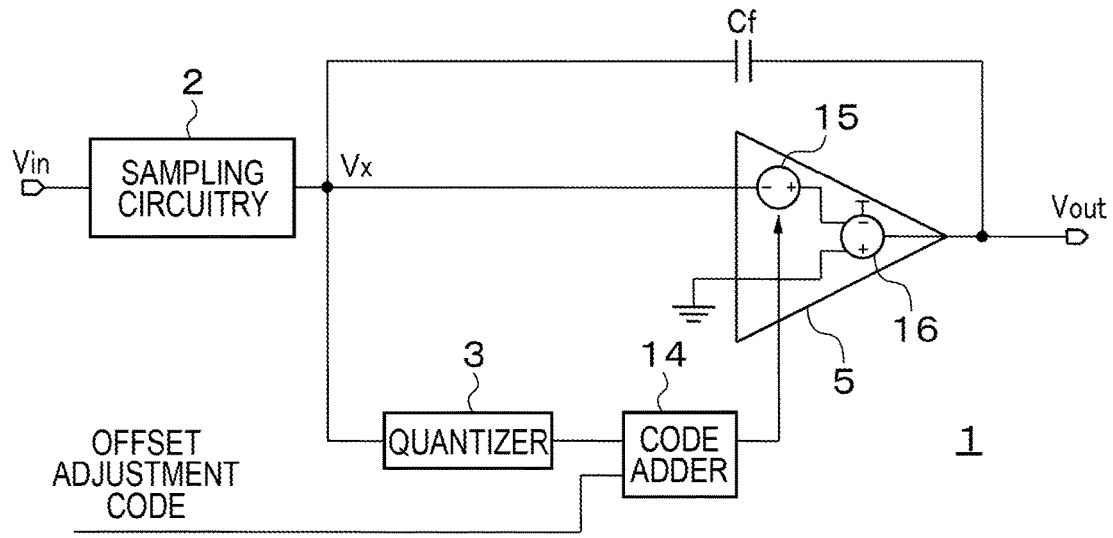
FIG. 13 is a block diagram showing a schematic configuration of an amplifier circuitry according to a fourth embodiment.

FIG. 13 is a block diagram showing a schematic configuration of an amplifier circuitry 1 according to a fourth embodiment. The amplifier circuitry 1 of FIG. 13 includes an operational amplifier 5 having a configuration different from those of the operational amplifiers 5 according to the first to third embodiments and a code adder 14.

The operational amplifier 5 of FIG. 13 has a function of performing offset adjustment by an external offset adjustment code. More specifically, the operational amplifier 5 of FIG. 13 has an offset adjuster 15 and an internal amplifier 16. The external offset adjustment code is originally input to the offset adjuster 15. However, in this embodiment, an output code of the code adder 14 is input to the offset adjuster 15.

The code adder 14 adds an offset adjustment code output from a processor not shown in the drawings and an output code of a quantizer 3. The offset adjustment code is, for example, a signal generated previously in consideration of manufacturing variations for each operational amplifier 5. By adding the output code of the quantizer 3 to the offset adjustment code, it is possible to perform offset adjustment so that an inverting input terminal voltage Vx of the operational amplifier 5 becomes zero.

The offset adjuster 15 in the operational amplifier 5 outputs an offset adjustment voltage obtained by offset-adjusting an output voltage Vx of a sampling circuitry 2, according to the output code of the code adder 14. The internal amplifier 16 amplifies a differential voltage between the offset adjustment voltage and a reference voltage.

In the amplifier circuitry 1 of FIG. 13, before inputting the output code of the quantizer 3 to the code adder 14, similar to FIG. 9, the output code of the quantizer 3 may be input to a digital operator 8, may be multiplied by a predetermined value, and may be input to the code adder 14.

As such, in the fourth embodiment, the operational amplifier 5 having the offset adjustment function can be used. This type of operational amplifier 5 performs the offset adjustment on the basis of the offset adjustment code input from the outside. Therefore, in this embodiment, the output code of the quantizer 3 is added to the offset adjustment code by the code adder 14 and the output code of the code adder 14 is input as a new offset adjustment code to the operational amplifier 5. As a result, the operational amplifier 5 can perform the offset adjustment so that the inverting input terminal voltage Vx becomes zero, in addition to the offset adjustment taking manufacturing variations into consideration, and the same effects as those of the first to third embodiments are obtained.

(Fifth Embodiment)

In a fifth embodiment, a sequential comparison is performed on an inverting input terminal voltage Vx of an operational amplifier 5 and offset adjustment of the operational amplifier 5 is performed.

Figure 14:
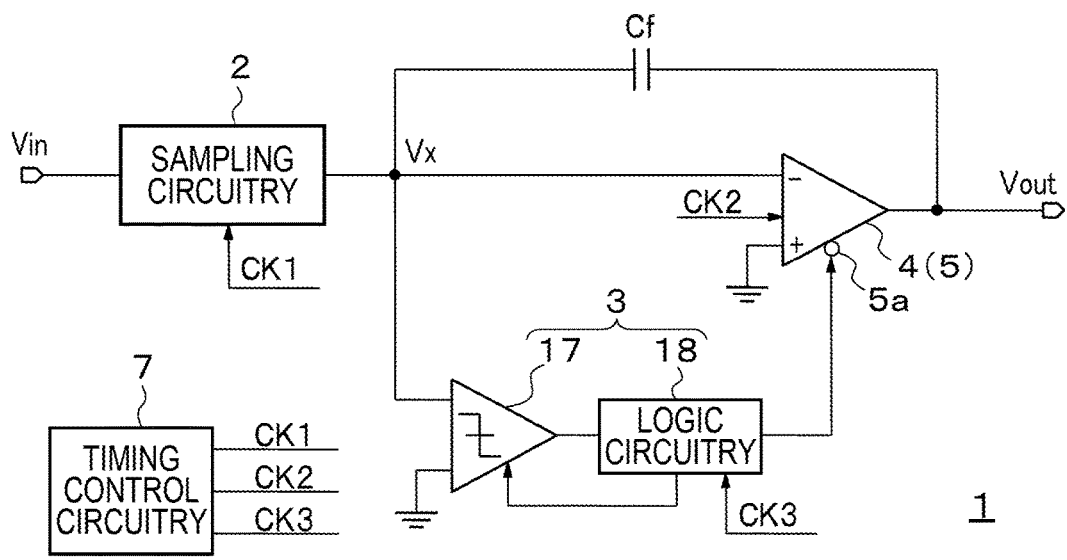
FIG. 14 is a block diagram showing a schematic configuration of an amplifier circuitry according to a fifth embodiment.

FIG. 14 is a block diagram showing a schematic configuration of an amplifier circuitry 1 according to the fifth embodiment. The amplifier circuitry 1 of FIG. 14 is different from the amplifier circuitry 1 of FIG. 7 in a configuration of a quantizer 3.

The quantizer 3 of FIG. 14 has a comparator 17 and a logic circuitry 18. The comparator 17 outputs a signal of different logic, according to whether or not an output voltage Vx of a sampling circuitry 2 exceeds a predetermined reference voltage (for example, a ground voltage). For example, when the output voltage Vx of the sampling circuitry 2 exceeds 0V, the comparator 17 outputs "1 " and when the output voltage Vx of the sampling circuitry 2 is less than 0V, the comparator 17 outputs "0".

The logic circuitry 18 sequentially adjusts an offset control code to adjust an offset voltage of a differential amplifier in units of bits, according to the output signal of the comparator 17. More specifically, the logic circuitry 18 adjusts a bit value sequentially from an MSB of an output code (offset control code), whenever the comparator 17 outputs a signal showing a new comparison result. For example, the logic circuitry 18 sets a bit value of the MSB of the offset control code to "1" or "0", according to whether an output signal showing a first comparison result of the comparator 17 is "1" or "0". Thereafter, the logic circuitry 18 sets a bit value of a second bit from the MSB of the offset control code to "1" or "0", according to whether an output signal showing a second comparison result of the comparator 17 is "1" or "0".

As such, the quantizer 3 of FIG. 14 sequentially adjusts the offset control code from the MSB, whenever the comparator 17 outputs the output signal showing the new comparison result. The offset control code output from the quantizer 3 is input to an offset control terminal 5a of the operational amplifier 5. As a result, the operational amplifier 5 performs the offset adjustment according to the offset control code, similar to the amplifier circuitry 1 of FIG. 7.

Figure 15:
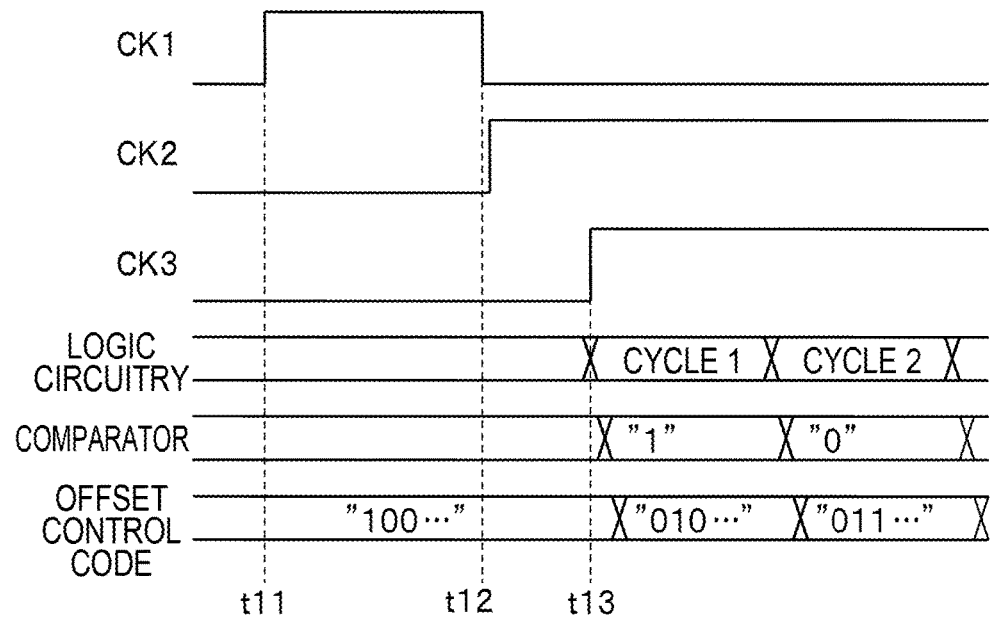
FIG. 15 is a timing waveform diagram of first to third clock signals CK1 to CK3 and a quantizer of FIG. 14.

The amplifier circuitry 1 of FIG. 14 includes the same timing control circuitry 7 as that of the amplifier circuitry 1 of FIG. 7. FIG. 15 is a timing waveform diagram of first to third clock signals CK1 to CK3 output by the timing control circuitry 7 and the quantizer 3 of FIG. 14.

The sampling circuitry 2 samples an input voltage Vin in a period (from time t11 to time t12) in which the first clock signal CK1 is high and the operational amplifier 5 performs an amplification operation in a period (from time t12 to time t13) in which the first clock signal CK1 is low, the second clock signal CK2 is high, and the third clock signal CK3 is low, similar to the timing control circuitry 7 of FIG. 7. The logic circuitry 18 starts an operation at a rising edge of the third clock signal CK3 in a period (after time t13) in which and thereafter) when the first clock signal CK1 is low, the second clock signal CK2 is high, and the third clock signal CK3 is high. The logic circuitry 18 first outputs an initial code of the offset control code. The operational amplifier 5 performs the offset adjustment on the basis of the initial code and the inverting input terminal voltage Vx is set accordingly. The comparator 17 performs a comparison operation on the basis of the inverting input terminal voltage Vx and the bit value of the MSB of the offset control code is adjusted on the basis of an output signal of the comparator 17 showing a comparison result. After time t13, each bit of the offset control code is sequentially adjusted from the MSB to the LSB for each cycle in which the comparator 17 performs the comparison operation.

As such, in the fifth embodiment, processing for comparing the inverting input terminal voltage Vx of the operational amplifier 5 with a reference voltage by the comparator 17 to generate the offset control code and processing for performing the offset adjustment of the operational amplifier 5 on the basis of the offset control code are sequentially repeated. As a result, the inverting input terminal voltage Vx of the operational amplifier 5 can be gradually converged to zero.

Although the amplifier circuitry 1 of FIG. 14 includes the timing control circuitry 7, the timing control circuitry 7 may be removed from the amplifier circuitry 1 and the first to third clock signals CK1 to CK3 may be externally input to the amplifier circuitry 1.

(Sixth Embodiment)

Figure 16:
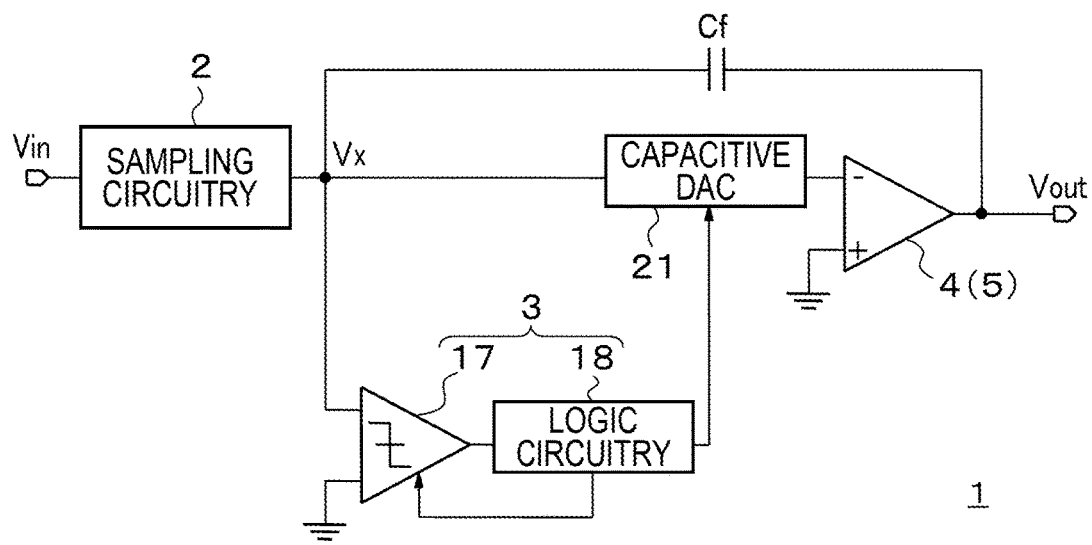
FIG. 16 is a block diagram of an amplifier circuitry according to a sixth embodiment.

FIG. 16 is a block diagram of an amplifier circuitry 1 according to a sixth embodiment. The amplifier circuitry 1 of FIG. 16 is different from the amplifier circuitry 1 of FIG. 14 in that an operational amplifier 5 not having an offset control terminal 5a is used and a capacitive DAC (offset adjustment circuitry) 21 is connected to an inverting input terminal of the operational amplifier 5.

Figure 17:
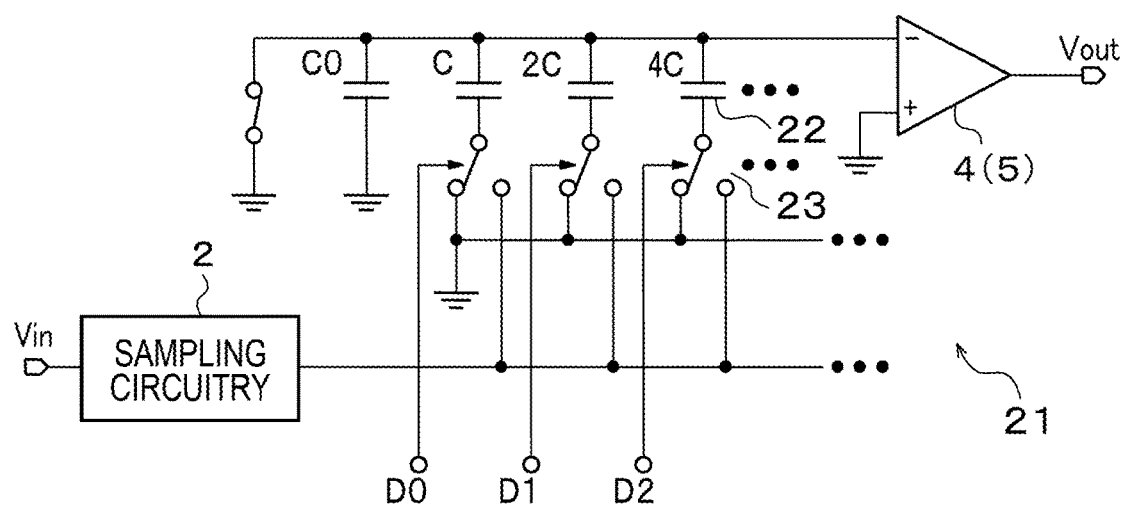
FIG. 17 is a circuitry diagram showing an internal configuration of a capacitive DAC.

FIG. 17 is a circuitry diagram showing an internal configuration of a capacitive DAC 21. The capacitive DAC 21 of FIG. 17 has a plurality of capacitors 22 connected to the inverting input terminal of the operational amplifier 5 and a plurality of switches 23 connected to the other ends of these capacitors 22. Capacities of the plurality of capacitors 22 are different by multiples of 2. Each switch 23 switches between inputting an output voltage of the sampling circuitry 2 to the other end of the corresponding capacitor 22 and setting a voltage to a ground voltage. These switches 23 are turned on or off by an offset control code output from a logic circuitry 18 in a quantizer 3. The capacitive DAC 21 redistributes charges using the plurality of capacitors 22, according to turning on or off of each switch 23, and generates an analog voltage according to turning on or off of each switch 23. That is, the capacitive DAC 21 generates an analog voltage according to the offset control code from the logic circuitry 18. The analog voltage generated by the capacitive DAC 21 is input to the inverting input terminal of the operational amplifier 5.

In the amplifier circuitry 1 of FIG. 14, the offset control code output from the logic circuitry 18 is input to the offset control terminal 5a of the operational amplifier 5. However, in the amplifier circuitry 1 of FIG. 16, the analog voltage according to the offset control code output from the amplifier circuitry 1 is generated by the capacitive DAC 21 and is input to the inverting input terminal of the operational amplifier 5.

As such, in the sixth embodiment, by inputting an analog voltage according to an offset control code obtained by quantizing an inverting input terminal voltage Vx of the operational amplifier 5 to the inverting input terminal of the operational amplifier 5, the offset adjustment of the operational amplifier 5 can be sequentially performed so that the inverting input terminal voltage Vx gradually approximates to zero.

(Seventh Embodiment)

A pipeline type AD converter is configured using an amplifier circuitry 1 according to any one of the first to sixth embodiments.

Figure 18:
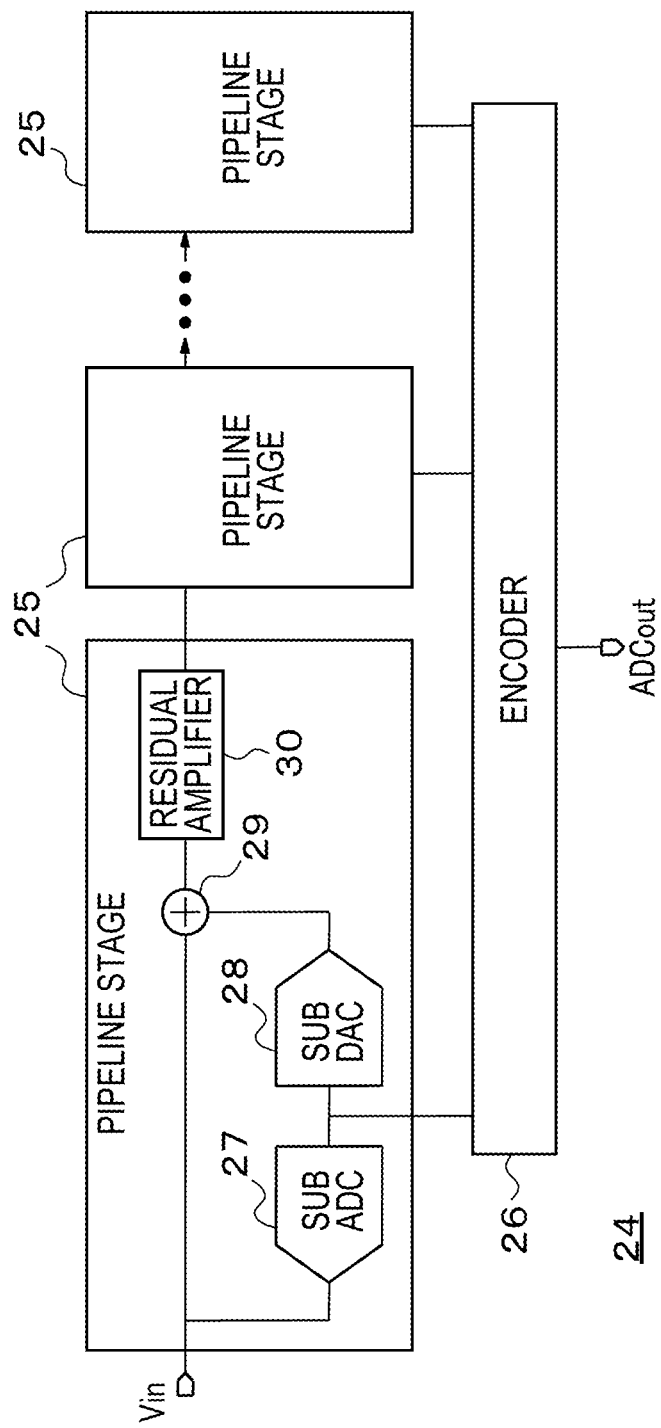
FIG. 18 is a block diagram showing a schematic configuration of a pipeline type AD converter using an amplifier circuitry according to a seventh embodiment.

FIG. 18 is a block diagram showing a schematic configuration of a pipeline type AD converter 24 using an amplifier circuitry 1 according to a seventh embodiment. The AD converter 24 of FIG. 18 includes a plurality of pipeline stages 25 connected in cascade and an encoder 26 to encode output codes of the pipeline stages 25.

Each pipeline stage 25 has a sub AD converter (sub ADC) 27, a sub DA converter (sub DAC) 28, a subtracter 29, and a residual amplifier 30. The sub AD converter 27 AD-converts an input voltage Vin and outputs a first output code. The sub DA converter 28 DA-converts first encoding data obtained by encoding the first output code by the encoder 26. The subtracter 29 generates a residual voltage between the input voltage Vin and an output voltage of the sub DA converter 28 and outputs the residual voltage.

The residual amplifier 30 is configured using the amplifier circuitry 1 according to any one of the first to sixth embodiments. The input voltage Vin of the amplifier circuitry 1 according to any one of the first to sixth embodiments is the output voltage of the subtracter 29. In addition, an output voltage Vout of the amplifier circuitry 1 according to any one of the first to sixth embodiments becomes an output voltage of the residual amplifier 30 and becomes the input voltage Vin of the pipeline stage 25 at a next stage. That is, a residual amplification voltage output from the pipeline stage 25 at the previous stage is input as the input voltage Vin to each of the pipeline stages 25 at second and following stages among the plurality of pipeline stages 25 connected in cascade.

The encoder 26 outputs a final output code on the basis of the output code of the sub AD converter 27 of each pipeline stage 25. The output code output from the encoder is a digital signal obtained by AD-converting the input voltage Vin input to the pipeline type AD converter 24 of FIG. 18.

As described above, in the seventh embodiment, when the pipeline type AD converter 24 is constructed by connecting the plurality of pipeline stages 25 in cascade, the amplifier circuitry 1 according to any one of the first to sixth embodiments can be used as the residual amplifier 30 in each pipeline stage 25.

The amplifier circuitries 1 according to the first to sixth embodiments can be used not only in the pipeline type AD converter 24 but also in AD converters 24 and DA converters 13 of various types and configurations.

(Eighth Embodiment)

A wireless communication device 31 is configured using an AD converter 24 described in the seventh embodiment.

Figure 19:
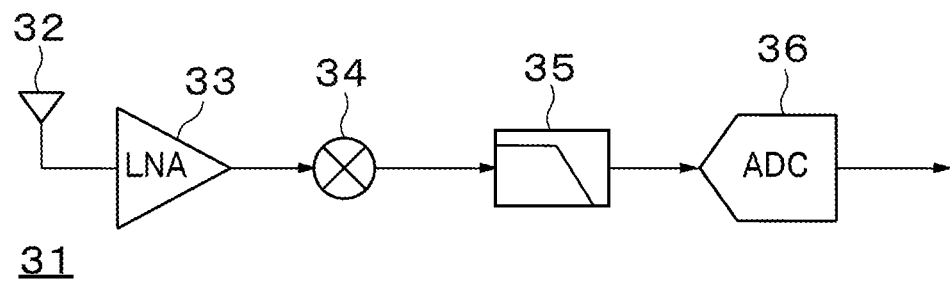
FIG. 19 is a block diagram showing a schematic configuration of a wireless communication device incorporating an amplifier circuitry according to an eighth embodiment.

FIG. 19 is a block diagram showing a schematic configuration of the wireless communication device 31 incorporating an amplifier circuitry 1 according to an eighth embodiment. The wireless communication device 31 of FIG. 19 includes an antenna 32, a low noise amplifier (LNA) 33, a mixer 34, a filter 35, and an AD converter (ADC) 24 according to the seventh embodiment. The low noise amplifier 33 amplifies a high frequency signal received by the antenna 32 and transmits the high frequency signal to the mixer 34. The mixer 34 frequency-converts the received high frequency signal into a baseband signal. The filter 35 removes unnecessary frequency components included in the baseband signal. The AD converter 24 converts an output signal of the filter 35 into a digital signal. The AD converter 24 is not limited to a pipeline type AD converter 24 shown in FIG. 18 and AD converters 24 of various types and configurations can be applied.

Figure 20:
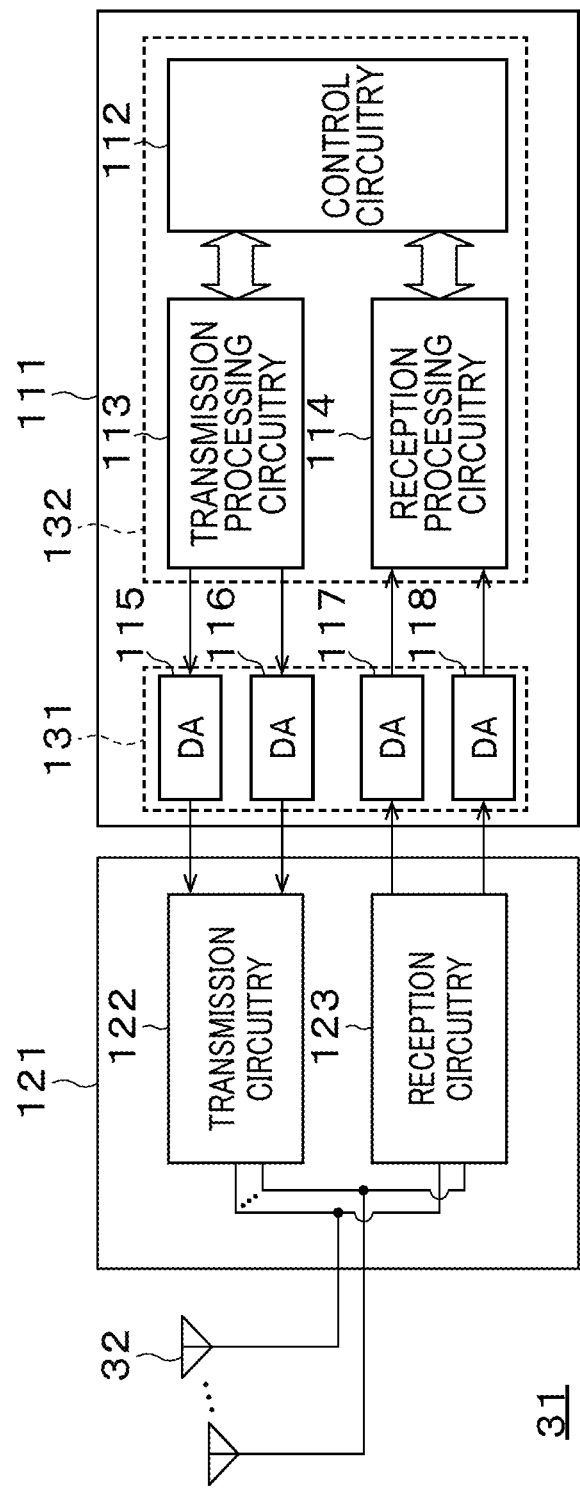
FIG. 20 is a block diagram showing an internal configuration of the wireless communication device, which shows FIG. 19 more specifically.

FIG. 20 is a block diagram showing an internal configuration of the wireless communication device 31, which shows FIG. 19 more specifically; FIG. 19 or 20 shows an example of the internal configuration of the wireless communication device 31 and various changes can be made. The wireless communication device 31 of FIG. 19 or 20 can use an amplifier circuitry 1 according to any one of the first to sixth embodiments as at least one of the amplifier circuitries 1 to be used, including an inner portion of the AD converter 24.

The wireless communication device 31 of FIG. 20 includes a baseband unit 111, an RF unit 121, and an antenna 32.

The baseband unit 111 includes a control circuitry 112, a transmission processing circuitry 113, a reception processing circuitry 114, DA converters 115 and 116, and ADCs 117 and 118. The RF unit 121 and the baseband unit 111 may be configured collectively as an integrated circuitry (IC) of one chip or may be configured as separate chips.

The baseband unit 111 is, for example, a baseband LSI or a baseband IC of one chip. In addition, the baseband unit 111 may include ICs of two chips including an IC 131 and an IC 132, as shown by broken lines in FIG. 20. In the example of FIG. 20, the IC 131 includes DA converters 115 and 116 and ADCs 117 and 118. The IC 132 includes a control circuitry 112, a transmission processing circuitry 113, and a reception processing circuitry 114. A method of dividing a configuration included in each IC is not limited thereto. In addition, the baseband unit 111 may be configured by three or more ICs.

The control circuitry 112 executes processing regarding communication with other terminals (including base stations). Specifically, the control circuitry 112 handles three types of MAC frames including a data frame, a control frame, and a management frame and executes various processing defined in a MAC layer. In addition, the control circuitry 112 may execute processing of upper layers (for example, TCP/IP or UDP/IP and an application layer thereon) of the MAC layer.

The transmission processing circuitry 113 receives the MAC frame from the control circuitry 112. The transmission processing circuitry 113 adds a preamble and a PHY header to the MAC frame or encodes or modulates the MAC frame. As a result, the transmission processing circuitry 113 converts the MAC frame into a PHY packet.

The DA converters 115 and 116 DA-converts the PHY packet output by the transmission processing circuitry 113. In the example of FIG. 20, two systems of DA converters 13 are provided and execute parallel processing. However, one DA converter 13 may be provided or DA converters 13 of the same number as the number of antennas 32 may be provided.

The RF unit 121 is, for example, an RF analog IC or a high frequency IC of one chip. The RF unit 121 may be configured as one chip together with the baseband unit 111 or may be configured by two chips of an IC including a transmission circuitry 122 and an IC including a reception processing circuitry.

The RF unit 121 includes a transmission circuitry 122 and a reception circuitry 123.

The transmission circuitry 122 executes analog signal processing on the PHY packet DA-converted by the DA converters 115 and 116. The analog signal output by the transmission circuitry 122 is wirelessly transmitted via the antenna 32. The transmission circuitry 122 includes a transmission filter, a mixer, and a power amplifier (PA) not shown in FIG. 20.

The transmission filter extracts a signal of a desired band from a signal of the PHY packet DA-converted by the DA converters 115 and 116. The mixer up-converts the signal filtered by the transmission filter into a radio frequency, using a signal of a constant frequency supplied from an oscillation device. The power amplifier amplifies the signal after the up-conversion. The amplified signal is supplied to the antenna 32 and the radio signal is transmitted.

The reception circuitry 123 executes analog signal processing on the signal received by the antenna 32. The signal output by the reception circuitry 123 is input to the ADCs 117 and 118. The reception circuitry 123 includes a low noise amplifier (LNA) 33, a mixer 34, and a reception filter 35.

The LNA amplifies the signal received by the antenna 32. The mixer 34 down-converts the amplified signal into the baseband signal, using the signal of the constant frequency supplied from the oscillation device. The reception filter 35 extracts a signal of a desired band from the signal after the down-conversion. The extracted signal is input to the ADCs 117 and 118.

The ADCs 117 and 118 AD-converts the input signal from the reception circuitry 123. In the example of FIG. 20, the two systems of ADCs are provided and execute the parallel processing. However, one ADC may be provided or the ADCs of the same number as the number of antennas 32 may be provided.

In this embodiment, each of the ADCs 117 and 118 includes the amplifier circuitry 1 according to any one of the above embodiments. For example, each of the ADCs 117 and 118 may be the ADC according to the seventh embodiment. By this configuration, power consumption of the wireless communication device 31 can be reduced.

The reception processing circuitry 114 receives the PHY packet AD-converted by the ADCs 117 and 118. The reception processing circuitry 114 performs demodulation and decoding of the PHY packet and removal of the preamble and the PHY header from the PHY packet. As a result, the reception processing circuitry 114 converts the PHY packet into a MAC frame. The frame processed by the reception processing circuitry 114 is input to the control circuitry 112.

In the example of FIG. 20, although the DA converters 115 and 116 and the ADCs 117 and 118 are arranged in the baseband unit 111, they may be arranged in the RF unit 121.

Figure 21:
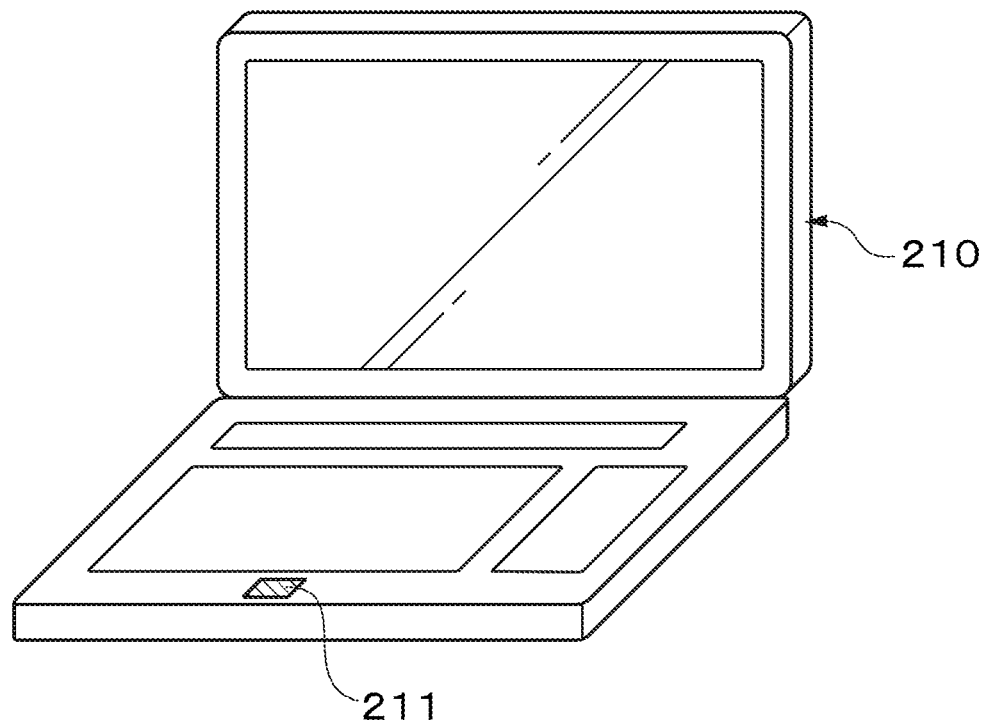
FIG. 21 is a perspective view showing a notebook PC including a wireless communication device.
Figure 22:
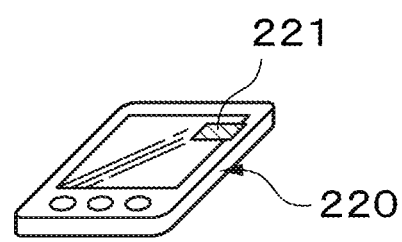
FIG. 22 is a perspective view showing a mobile terminal including a wireless communication device.

Each of FIGS. 21 and 22 is a perspective view showing a wireless communication terminal including the wireless communication device 31. The wireless communication terminal of FIG. 21 is a notebook PC 210 and the wireless communication terminal of FIG. 22 is a mobile terminal 220. Each of the notebook PC 210 and the mobile terminal 220 is mounted with the wireless communication device 31.

The wireless communication terminal mounted with the wireless communication device 31 is not limited to the notebook PC or the mobile terminal. The wireless communication device 31 can be mounted on a TV, a digital camera, a wearable device, a tablet, a smartphone, a game device, a network storage device, a monitor, a digital audio player, a web camera, a video camera, a project, a navigation system, an external adapter, an internal adapter, a set-top box, a gateway, a printer server, a mobile access point, a router, an enterprise/service provider access point, a portable device, a handheld device, and the like, for example.

Figure 23:
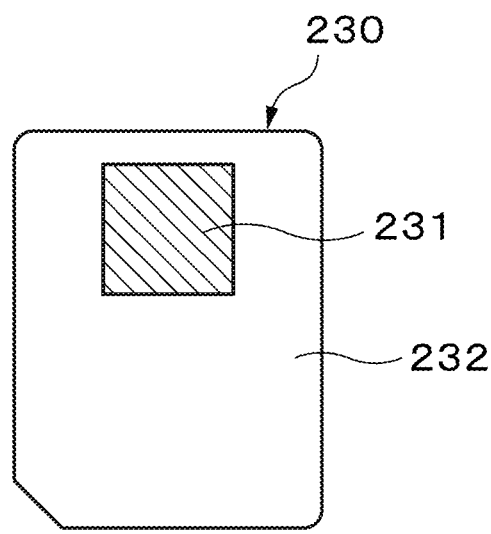
FIG. 23 is a plan view showing a memory card mounted with a wireless communication device.

In addition, the wireless communication device 31 can be mounted on a memory card. FIG. 23 is a plan view showing a memory card 40 mounted with the wireless communication device 31. The memory card 40 includes the wireless communication device 31 and a memory card body 41. The memory card 40 uses the wireless communication device 31 for wireless communication with an external device (a wireless communication terminal or a base station). In FIG. 23, other elements (for example, a memory and the like) in the memory card 40 are omitted.

(Ninth Embodiment)

A sensor system according to a ninth embodiment will be described with reference to FIG. 24. A sensor system 42 according to this embodiment includes the amplifier circuitry 1 according to any one of the above embodiments.

Figure 24:
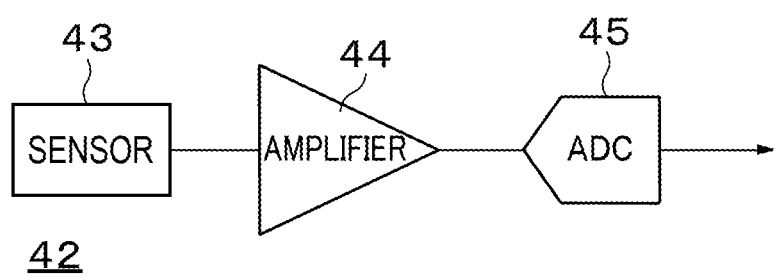
FIG. 24 is a diagram showing an example of a sensor system according to this embodiment.

FIG. 24 is a diagram showing an example of the sensor system 42 according to this embodiment. As shown in FIG. 24, the sensor system 42 includes a sensor 43, an amplifier 44, and an AD converter 24. The sensor 43 outputs an electric signal according to a sensed physical amount. The type of the sensor 43 can be arbitrarily selected like a temperature sensor 43 and an acceleration sensor 43.

The amplifier 44 amplifies the electric signal output by the sensor 43. As the amplifier 44, the amplifier circuitry 1 according to any one of the above embodiments may be used. As a result, it is possible to reduce power consumption of the sensor system 42.

The AD converter 24 AD-converts the signal amplified by the amplifier 44. As the AD converter 24, for example, the AD converter 24 including the amplifier circuitry 1 according to any one of the above embodiments, such as the AD converter 24 according to the seventh embodiment, may be used. As a result, it is possible to reduce power consumption of the sensor system 42.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. Amplifier circuitry comprising:
sampling circuitry which samples an input voltage;
a quantizer which quantizes an output voltage of the sampling circuitry and outputs an output code;
a differential amplifier which amplifies a differential voltage between the output voltage of the sampling circuitry and a reference voltage and performs offset adjustment according to the output code of the quantizer; and
a first capacitor which is connected between an output node of the differential amplifier and an output node of the sampling circuitry;
wherein the differential amplifier further comprises:
an offset control terminal to which the output code of the quantizer is input; and offset control circuitry which controls an amplification factor of the differential voltage, in accordance with the output code of the quantizer input to the offset control terminal.

2. The amplifier circuitry according to claim 1, wherein the differential amplifier adjusts a voltage of at least one of reciprocal input terminals in accordance with the output code of the quantizer and performs the offset adjustment.

3. The amplifier circuitry according to claim 2, further comprising:
a DA converter which outputs an analog voltage in accordance with the output code of the quantizer, wherein
the differential amplifier amplifies a differential voltage between the output voltage of the sampling circuitry and the analog voltage.

4. The amplifier circuitry according to claim 2, further comprising:
a DA converter which outputs an analog voltage in accordance with the output code of the quantizer; and
an offset addition circuitry which outputs an offset addition voltage obtained by adding the analog voltage to the output voltage of the sampling circuitry, wherein
the differential amplifier amplifies a differential voltage between the offset addition voltage and the reference voltage.

5. The amplifier circuitry according to claim 1, further comprising:
a code adder which adds an offset adjustment code in accordance with an offset voltage of the differential amplifier and the output code of the quantizer, wherein the differential amplifier comprises:
an offset adjuster which outputs an offset adjustment voltage obtained by offset-adjusting the output voltage of the sampling circuitry, in accordance with an output code of the code adder; and
an internal amplifier which amplifies a differential voltage between the offset adjustment voltage and the reference voltage.

6. The amplifier circuitry according to claim 1, wherein the quantizer comprises:
a comparator which outputs a signal of different logic in accordance with whether or not the output voltage of the sampling circuitry exceeds a predetermined reference voltage; and
logic circuitry which sequentially adjusts an offset control code to adjust an offset voltage of the differential amplifier in units of bits, in accordance with an output signal of the comparator, and
the differential amplifier performs the offset adjustment on the basis of the offset control code.

7. The amplifier circuitry according to claim 6, further comprising:
offset adjustment circuitry which outputs an offset adjustment voltage obtained by adjusting the output voltage of the sampling circuitry in accordance with the offset control code, wherein
the differential amplifier amplifies a differential voltage between the offset adjustment voltage and the reference voltage.

8. The amplifier circuitry according to claim 1, wherein the sampling circuitry comprises:
a second capacitor which accumulates charges according to the input voltage; and
a plurality of switches which control charging/discharging of the second capacitor.

9. The amplifier circuitry according to claim 8, further comprising:
timing control circuitry which executes timing control of the sampling circuitry, the quantizer, and the differential amplifier, wherein
the timing control circuitry executes
control which sequentially repeats a first period in which charges in accordance with a sampling voltage of the input voltage are accumulated in the second capacitor, a second period in which the differential voltage is amplified by the differential amplifier, and a third period in which the output voltage of the sampling circuitry is quantized by the quantizer.

10. The amplifier circuitry according to claim 9, wherein the timing control circuitry generates a first clock signal, a second clock signal, and a third clock signal indicating switching of the first period, the second period, and the third period, and
the sampling circuitry, the differential amplifier, and the quantizer sequentially repeat the operations of the first period, the second period, and the third period in synchronization with the first, second, and third clock signals.

11. The amplifier circuitry according to claim 10, further comprising:
a digital operator which outputs an adjustment output code obtained by multiplying the output code of the quantizer by a predetermined value, wherein
the differential amplifier performs the offset adjustment according to the adjustment output code.

12. An AD converter comprising:
a plurality of pipeline stages which are connected in cascade and each of which AD-converts an input voltage and outputs an output code; and
an encoder which encodes output codes of the plurality of pipeline stages, wherein
at least one of the plurality of pipeline stages comprises:
a sub AD converter which AD-converts the input voltage and outputs a first output code;
a sub DA converter which DA-converts first encoding data obtained by encoding the first output code by the encoder;
a subtracter which outputs a residual voltage between the input voltage and an output voltage of the sub DA converter; and a residual amplifier which amplifies the residual voltage and outputs a residual amplification voltage, the residual amplification voltage output from the pipeline stage at a previous stage is input as the input voltage to each of the pipeline stages at second and following stages among the plurality of pipeline stages connected in cascade, and the residual amplifier comprises:

a sampling circuitry which samples the input voltage;

a quantizer which quantizes an output voltage of the sampling circuitry and outputs an output code;

a differential amplifier which amplifies a differential voltage between the output voltage of the sampling circuitry and a reference voltage and performs offset adjustment according to the output code of the quantizer; and a first capacitor which is connected between an output node of the differential amplifier and an output node of the sampling circuitry.

13. The AD converter according to claim 12, wherein the differential amplifier comprises:

an offset control terminal to which the output code of the quantizer is input; and offset control circuitry which controls an amplification factor of the differential voltage, in accordance with the output code of the quantizer input to the offset control terminal.

14. The AD converter according to claim 12, wherein the differential amplifier adjusts a voltage of at least one of reciprocal input terminals in accordance with the output code of the quantizer and performs the offset adjustment.

15. The AD converter according to claim 14, further comprising:

a DA converter which outputs an analog voltage in accordance with the output code of the quantizer, wherein the differential amplifier amplifies a differential voltage between the output voltage of the sampling circuitry and the analog voltage.

16. The AD converter according to claim 14, further comprising:

a DA converter which outputs an analog voltage in accordance with the output code of the quantizer; and an offset addition circuitry which outputs an offset addition voltage obtained by adding the analog voltage to the output voltage of the sampling circuitry, wherein the differential amplifier amplifies a differential voltage between the offset addition voltage and the reference voltage.

17. The AD converter according to claim 12, further comprising:

a code adder which adds an offset adjustment code in accordance with an offset voltage of the differential amplifier and the output code of the quantizer, wherein the differential amplifier comprises:

an offset adjuster which outputs an offset adjustment voltage obtained by offset-adjusting the output voltage of the sampling circuitry, in accordance with an output code of the code adder; and an internal amplifier which amplifies a differential voltage between the offset adjustment voltage and the reference voltage.

18. The AD converter according to claim 12, wherein the quantizer comprises:

a comparator which outputs a signal of different logic in accordance with whether or not the output voltage of the sampling circuitry exceeds a predetermined reference voltage; and logic circuitry which sequentially adjusts an offset control code to adjust an offset voltage of the differential amplifier in units of bits, in accordance with an output signal of the comparator, and the differential amplifier performs the offset adjustment on the basis of the offset control code.

19. A wireless communication device comprising an AD converter, wherein the AD converter comprises:

a plurality of pipeline stages which are connected in cascade and each of which AD-converts an input voltage and outputs an output code; and an encoder which encodes output codes of the plurality of pipeline stages, wherein at least one of the plurality of pipeline stages comprises:

a sub AD converter which AD-converts the input voltage and outputs a first output code;

a sub DA converter which DA-converts first encoding data obtained by encoding the first output code by the encoder;

a subtracter which outputs a residual voltage between the input voltage and an output voltage of the sub DA converter; and a residual amplifier which amplifies the residual voltage and outputs a residual amplification voltage, the residual amplification voltage output from the pipeline stage at a previous stage is input as the input voltage to each of the pipeline stages at second and following stages among the plurality of pipeline stages connected in cascade, and the residual amplifier comprises:

a sampling circuitry which samples the input voltage;

a quantizer which quantizes an output voltage of the sampling circuitry and outputs an output code;

a differential amplifier which amplifies a differential voltage between the output voltage of the sampling circuitry and a reference voltage and performs offset adjustment according to the output code of the quantizer; and a first capacitor which is connected between an output node of the differential amplifier and an output node of the sampling circuitry.

* * * * *